(12) United States Patent
Wang et al.

(10) Patent No.: US 10,882,296 B2
(45) Date of Patent: Jan. 5, 2021

(54) FILM-PEELING APPARATUS

(71) Applicant: KINSUS INTERCONNECT TECHNOLOGY CORP., Taoyuan (TW)

(72) Inventors: Shang-Chi Wang, Taoyuan (TW); Yun-Han Yeh, Taoyuan (TW); Cyuan-Bang Wu, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 53 days.

(21) Appl. No.: 16/199,565

(22) Filed: Nov. 26, 2018

(65) Prior Publication Data

US 2019/0160801 A1 May 30, 2019

(30) Foreign Application Priority Data

Nov. 30, 2017 (TW) .............................. 106142014 A

(51) Int. Cl.
| | |
|---|---|
| *B32B 43/00* | (2006.01) |
| *B32B 38/10* | (2006.01) |
| *B65H 41/00* | (2006.01) |
| *H05K 3/00* | (2006.01) |

(52) U.S. Cl.
CPC ............ *B32B 38/10* (2013.01); *B32B 43/006* (2013.01); *B65H 41/00* (2013.01); *H05K 3/00* (2013.01); *H05K 2203/0264* (2013.01); *Y10T 156/1137* (2015.01); *Y10T 156/1142* (2015.01); *Y10T 156/1168* (2015.01); *Y10T 156/1184* (2015.01); *Y10T 156/1939* (2015.01); *Y10T 156/1967* (2015.01); *Y10T 156/1978* (2015.01)

(58) Field of Classification Search
CPC . B32B 38/10; B32B 43/006; Y10T 156/1137; Y10T 156/1142; Y10T 156/1168; Y10T 156/1184; Y10T 156/1939; Y10T 156/1967; Y10T 156/1978
USPC ........ 156/708, 709, 714, 717, 757, 762, 764
See application file for complete search history.

(56) References Cited

U.S. PATENT DOCUMENTS

| | | | | |
|---|---|---|---|---|
| 4,770,737 A | * | 9/1988 | Seki ..................... | B29C 63/0013 156/361 |
| 6,089,770 A | * | 7/2000 | Kamijo .................. | B41J 3/4075 400/615.2 |

(Continued)

FOREIGN PATENT DOCUMENTS

| | | |
|---|---|---|
| CN | 1115958 A | 1/1996 |
| CN | 1756462 A | 4/2006 |

(Continued)

*Primary Examiner* — Mark A Osele
*Assistant Examiner* — Nickolas R Harm
(74) *Attorney, Agent, or Firm* — Juan Carlos A. Marquez; Marquez IP Law Office, PLLC

(57) ABSTRACT

A film-peeling apparatus is adapted to peel a protective film on a surface of a substrate. The surface of the substrate has a bare area which is not covered by the protective film. The film-peeling apparatus includes a punching member, a connector connected to the punching member, and a controller. The controller is configured for driving, through the connector, the punching member to punch at predetermined positions nearby or on a first edge of the protective film adjacent to the bare area.

19 Claims, 8 Drawing Sheets

(56) References Cited

U.S. PATENT DOCUMENTS

| | | | |
|---|---|---|---|
| 6,938,318 B2* | 9/2005 | Yotsumoto | B09B 3/0058 156/760 |
| 8,029,642 B2* | 10/2011 | Hagman | B32B 43/006 156/247 |
| 2006/0076104 A1* | 4/2006 | Inaishi | B29C 63/0013 156/249 |
| 2015/0314584 A1* | 11/2015 | Dong | B32B 43/006 156/701 |

FOREIGN PATENT DOCUMENTS

| | | |
|---|---|---|
| CN | 205380974 U | 7/2016 |
| CN | 206533623 U | 9/2017 |
| JP | 2000203759 A | 7/2000 |
| KR | 20120095774 A | 8/2012 |
| TW | 201507932 A | 3/2015 |
| TW | M516287 U | 1/2016 |

* cited by examiner

FILM-PEELING APPARATUS

CROSS-REFERENCE TO RELATED APPLICATION

This non-provisional application claims priority under 35 U.S.C. § 119(a) to Patent Application No. 106142014 filed in Taiwan, R.O.C. on Nov. 30, 2017, the entire contents of which are hereby incorporated by reference.

BACKGROUND

Technical Field

The disclosure describes a film-peeling apparatus adapted to peel a protective film on a substrate.

Description of the Related Art

Generally, a printed circuit board (PCB) is a substrate made of an acrylic resin, polycarbonate resin or polyester amine. One of the advantages of a protective film covering on a surface of a substrate is that the surface of the substrate is not easily contaminated by the dusts or contaminants. The protective film is made of polyethylene (PE) or polyethylene-terephthalate (PET). To use the PCB with the protective film before the development process and the etching process, the protective film needs to be peeled off the surface of the substrate manually or by embossing rollers.

SUMMARY

However, peeling the protective film by people or by embossing rollers easily damages the substrate and makes the substrate scratched, or bended. In order to use the embossing rollers to peel the protective film off the substrate, the edge of the protective film should be align with the edge of the substrate. Then, the aligned edges will be rolled by the embossing rollers. Consequently, rollers' rolling on the aligned edges creates film-scraps which contaminate the protective film and the substrate.

To address this issue, a film-peeling apparatus is provided. According to some embodiments, The film-peeling apparatus is adapted to peel a protective film on a surface of a substrate. The surface of the substrate has a bare area which is not covered by the protective film. The film-peeling apparatus comprises a punching member, a connector connected to the punching member, and a controller. The controller is configured for driving, through the connector, the punching member to punch at predetermined positions nearby or on a first edge of the protective film adjacent to the bare area.

According to some embodiment, the punching member comprises a punching head, and the controller is configured for driving the punching head to punch the predetermined positions.

According to some embodiments, the film-peeling apparatus comprises a blowing member and a pneumatic member. The blowing member has at least one blowing opening. The at least one blowing opening is toward the predetermined positions when the blowing member is driven by the controller. The pneumatic member, driven by the controller, is adapted for delivering air to the blowing member and out of the at least one blowing opening.

According to some embodiments, the punching member comprises a punching head and a nozzle. The nozzle is integrated with the punching head. When the controller drives the pneumatic member, the air from the pneumatic member is blown out from the center of the punching head.

According to some embodiments, the punching head has a cutting portion. The cutting portion creates at least one slit on the protective film during punches of the punching head on the predetermined positions.

According to some embodiments, the film-peeling apparatus comprises a clamping member. The controller is adapted for driving the clamping member to grip above at one of the predetermined positions and then for driving the clamping member to move toward the corner diagonal to the punched edge of the protective film.

According to some embodiments, a film-peeling apparatus is adapted to peel a protective film on a surface of a substrate. One edge of the protective film is flush with one edge of the substrate. The film-peeling apparatus comprises a punching member, a connector connected to the punching member, a blowing member, a pneumatic member and a controller. The punching member has a punching head and a nozzle. The punching member has a cutting portion. The blowing member has a blowing opening. The controller is configured for driving the punching member to make the punching head punch on the edge of the protective film and to make the cutting portion creates at least one slit on the protective film; for driving the blowing member to make the blowing opening face the punched edge of the protective film; and for driving the pneumatic member to deliver air to both the blowing member and the nozzle, and out of the blowing opening and out of the nozzle.

BRIEF DESCRIPTION OF THE DRAWINGS

The disclosure will become more fully understood from the detailed description given herein below for illustration, and thus not limitative of the disclosure.

DETAILED DESCRIPTION

Figure 1:
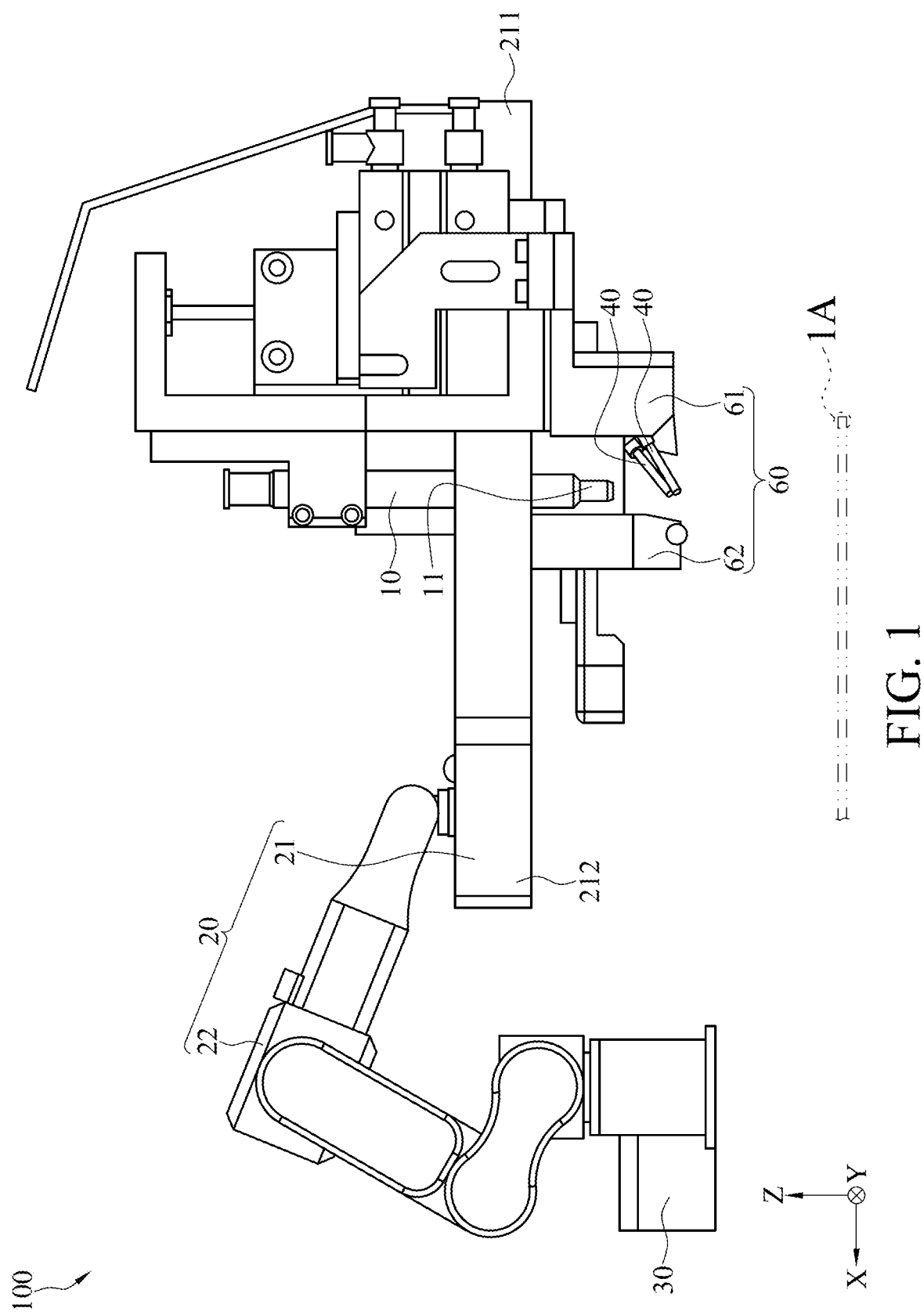
FIG. 1 illustrates a perspective view of a film-peeling apparatus according to a some embodiments of the present disclosures.
Figure 1A:
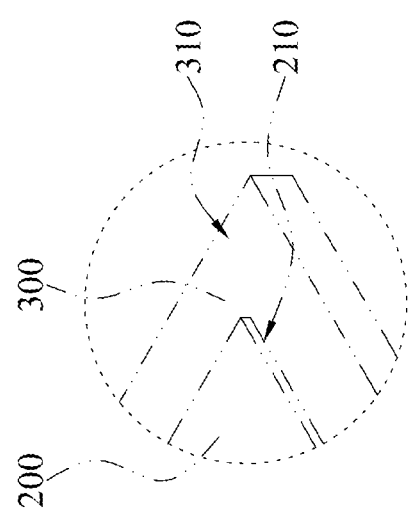
FIG. 1A illustrates a partially enlarged view of the substrate according to FIG. 1.
Figure 2:
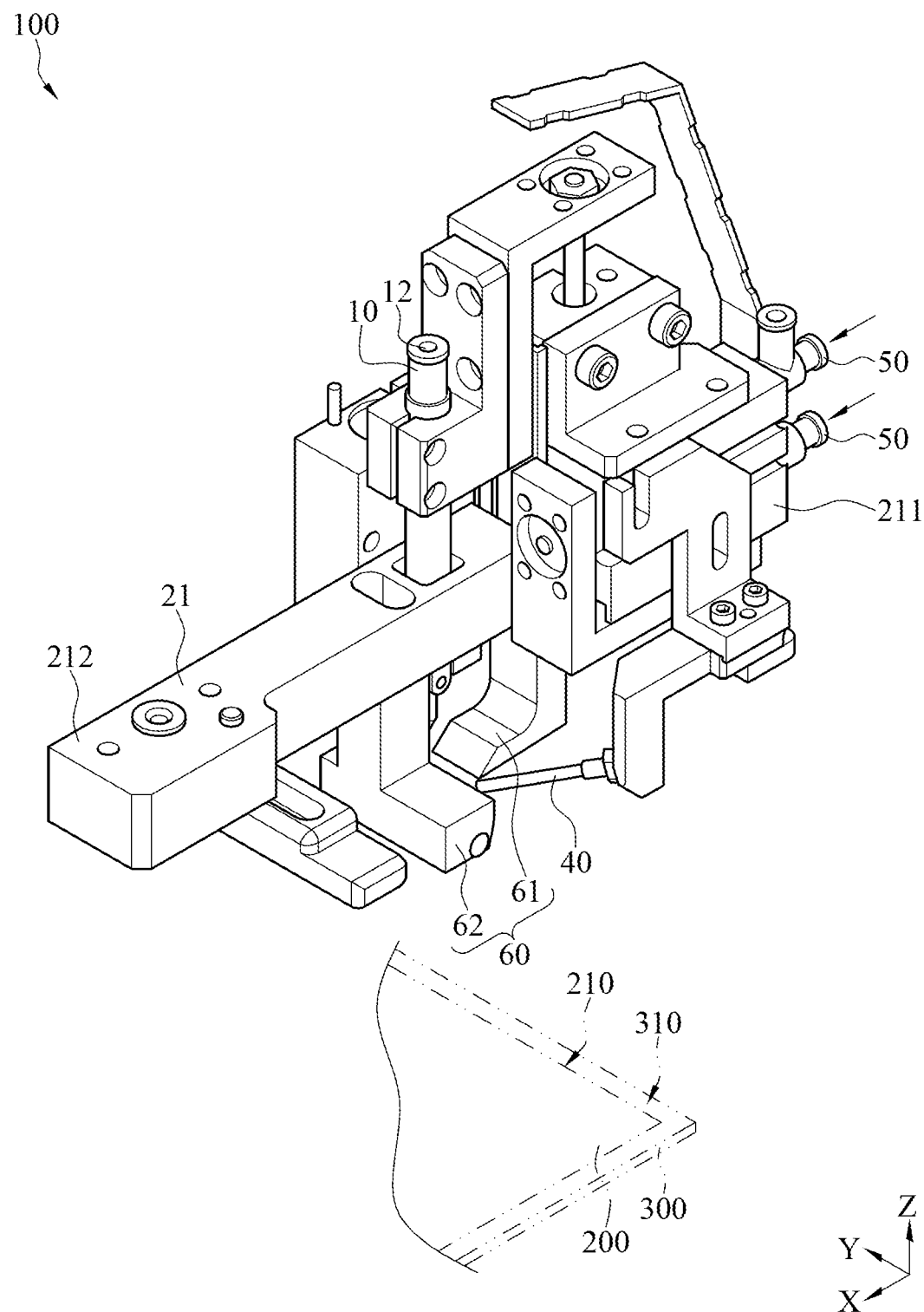
FIG. 2 illustrates a perspective view of the film-peeling apparatus according to FIG. 1.

Please refer to FIGS. 1, 1A and 2. According to some embodiments, a film-peeling apparatus 100 is adapted to peel a protective film 200 on a surface of a substrate 300. As shown on FIGS. 1 and 1A, the protective film 200 partially covers the surface of the substrate 300 and a bare area 310 of the surface is exposed.

In some embodiments, the substrate 300 may be made of inorganic materials or organic materials. For example, inorganic substrates are, but not limited to, ceramic substrates, metal substrates or other substrates. The ceramic substrates are, but not limited to, alumina substrates, aluminum nitride substrates, silicon carbide substrates, low temperature fired substrates or other ceramic substrates. The metal substrates are, but not limited to, copper/aluminum metal base substrates, copper/aluminum metal core substrates. The other substrates are a glass substrate or a silicon substrate. On the other hand, in some embodiments, the organic substrate is, but not limited to, a paper-phenolic based copper clad laminate, a glass based copper clad laminate, a composite copper clad laminate or a copper clad thermoplastic laminate. The paper-phenolic based copper clad laminate is, but not limited to, an epoxy resin copper clad laminate, a polyester copper clad laminate or a phenolic resin copper clad laminate. The glass based copper clad laminate is, but not limited to, a glass fiber copper clad laminate, an epoxy resin copper clad laminate or a polyester fiber copper clad laminate. The composite copper clad laminate is a glass epoxy copper clad laminate, a non-woven glass copper clad laminate, or an epoxide synthetic glass fiber copper-clad laminate. The copper clad thermoplastic laminate is, but not limited to, a poly-based resin, polyetherimide resin or a polyetheretherketone resin. The flexible copper-clad laminate is, but not limited to, a polyester copper clad laminate, an oxygen resin, a poly-arylene copper clad laminate or liquid crystal polymer copper clad laminate.

The protective film 200 on the surface of the substrate 300, according to some embodiments, is made of, but not limited to, a polyethylene (PE), or a polyethylene Terephthalate (PET). In addition, the protective film 200 may be contact with or cover the surface of the substrate 300. In some embodiments, the protective film 200 is adhered or attached to the surface of the substrate 300. The protective film 200 on the surface of the substrate 300 prevents the surface of the substrate 300 from being damaged or contaminated by dusts or contaminants. Next, the bare area 310 of the substrate 300 is the area which is not covered by the protective film. In some embodiments, as shown in FIG. 2, the bare area 310 is L shaped and the protective film 200 has a first edge which is parallel to axis Y and a second edge which is parallel to axis X. The first edge and the second edge intersect at a corner (the corner shown on FIG. 2). Thus, the first edge and the second edge are respectively adjacent to edges of the bare area 310. An adjacent area 210 is defined as the region embracing at least a portion of the first edge or embracing at least a portion of the second edge. The corner may be an acute angle, a right angle or an obtuse angle. In the embodiment shown in FIG. 2, the corner is a right angle. The adjacent area 210 parallel to Axis X and the adjacent area parallel to Axis Y create a right angle.

Please refer to FIGS. 1, 1A, 2 and 5. The film-peeling apparatus 100 includes a punching member 10, a connector 20 and a controller 30. The connector 20 is connected to the punching member 10. The controller 30 is configured for driving, through the connector, the punching member 10 to punch at positions A on the adjacent area 210 between the protective film 200 and the bare area 310. In the embodiment shown in FIG. 5, the positions A is on a second edge of the protective film 200 parallel to Axis X and adjacent to the bare area 310.

Please refer to FIGS. 1, 1A and 2. The punching member 10 may be, but not limited to, a center punch. The center punch includes a punching head 11 and a driving member connected to the punching head 11. The driving member may be as a motor or a hydraulic pump. The punching head 11 faces the surface of the substrate 300 which is covered the protective film 200. When the punching head 11 is driven by the controller 30, the punching head 11 punches the at least one of positions A. The punching direction (moving direction which the punching head makes the punches) may be parallel to the Axis Z or create an angle with Axis Z. After the punching head 11 punches the positions A, the punched area of the protective film 200 is deformed, becomes wrinkle, or lift up shown in FIG. 4. During the punches of the punching head 11 on the protective film 200, the punching head 11 might create slit on the protective film 200. Furthermore, the pressure of the punching head 11 may be, but not limited to, between 3Mpa and 5Mpa.

Please refer to FIGS. 1, 1A and 2. In some embodiments, the connector 20 includes a main beam 21 and a six-axis motion platform 22. The main beam 21 has a first end 211 and a second end 212 in a longitudinal direction (the X-axis or a horizontal direction of the FIG. 1). The punching member 10 may be connected to the first end 211 and the six-axis motion platform 22 may be connected to the second end 212 (see FIG. 1). The six-axis motion platform 22 is capable of moving individually along the X-axis, the Y-axis and the Z-axis in the Cartesian coordinate system and rotating individually along the X-axis, the Y-axis and the Z-axis. In another embodiment, the six-axis motion platform 22 may be one or more robot(s).

Please refer to FIGS. 1 and 1A. In some embodiments, the controller 30 includes a communicating unit, a storage and a processing unit connected with the communicating unit and the storage. The processing unit controls the communicating unit to receive or transmit control commands. The storage stores control data and at least one movement path. The controller 30, in accordance with the movement path, drives the six-axis motion platform 22 moving along the movement path. In some embodiments, the controller 30 is coupled to the six-axis motion platform 22. The controller 30 drives the six-axis motion platform 22 to move the punching head 11, and drives the punching head punch on positions A.

Figure 3:
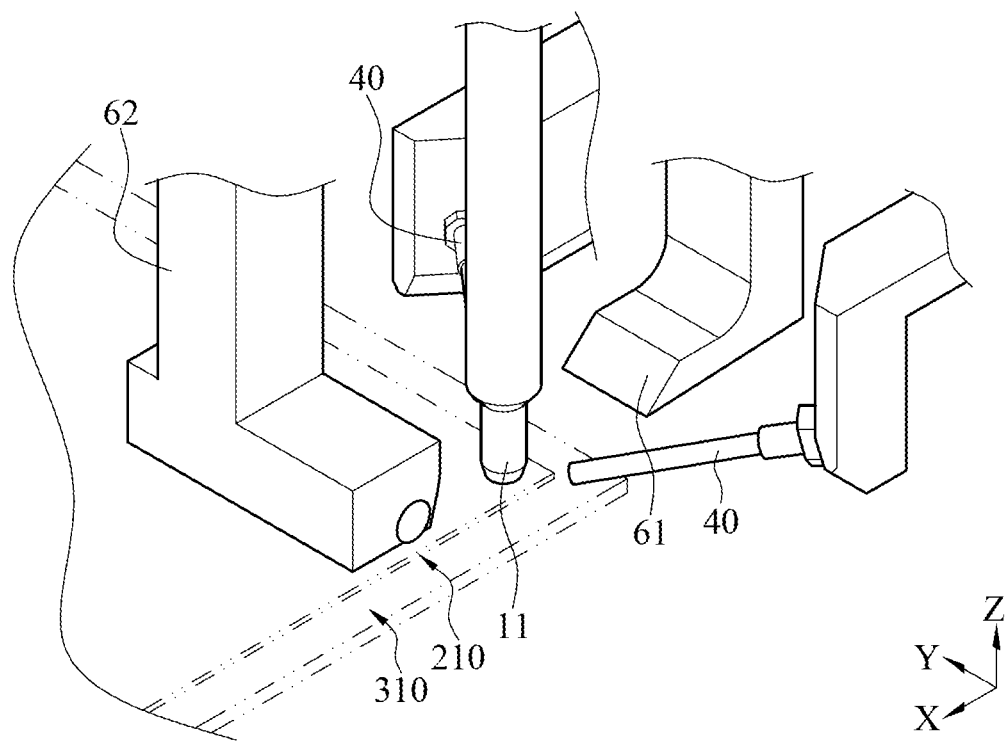
FIG. 3 illustrates an operation state (1) of the film-peeling apparatus according to FIG. 1.
Figure 4:
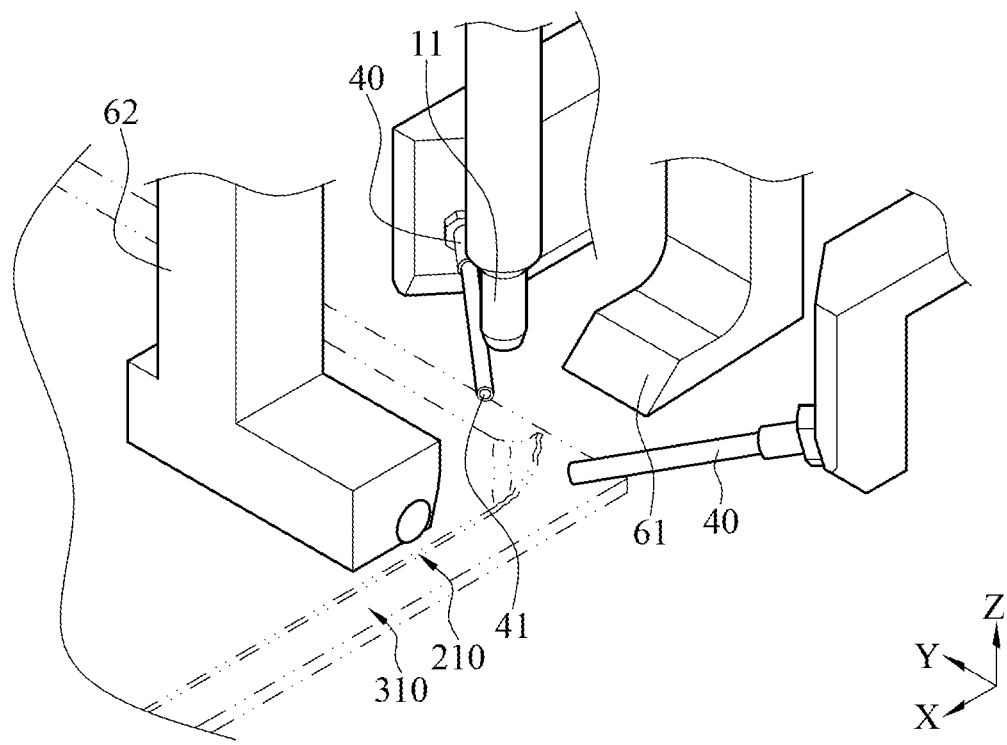
FIG. 4 illustrates an operation state (2) of the film-peeling apparatus according to FIG. 1.
Figure 5:
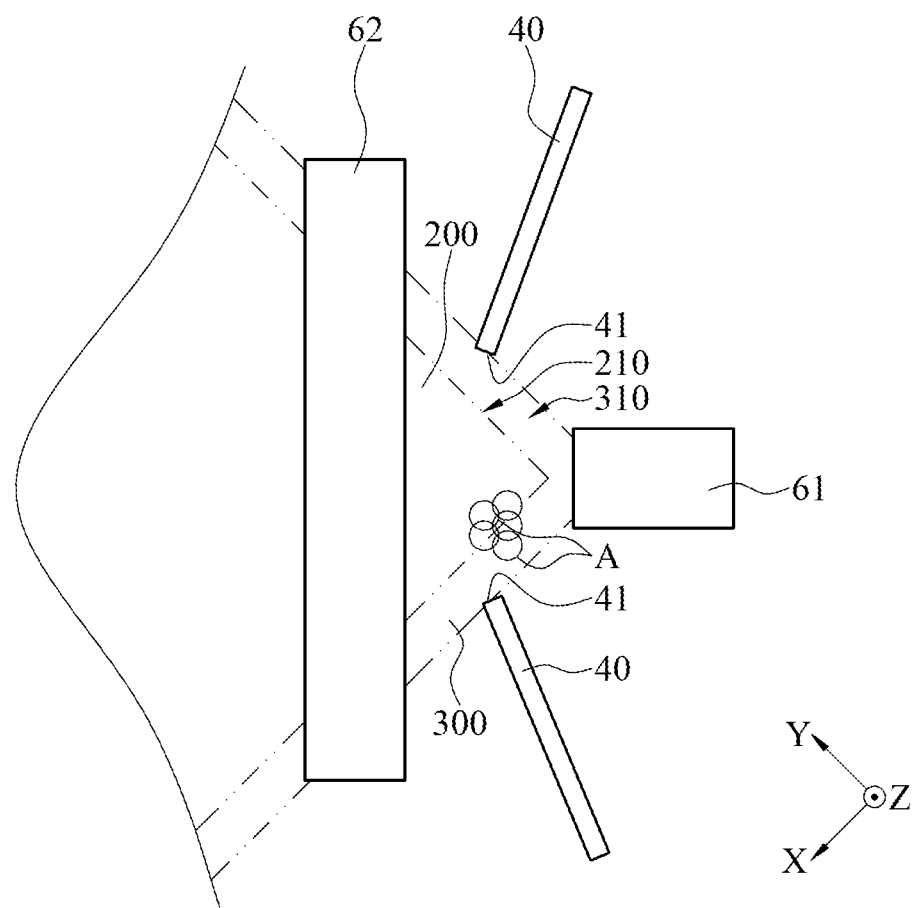
FIG. 5 illustrates an operation state (3) of the film-peeling apparatus according to FIG. 1.

Please refer to FIGS. 3-5. FIGS. 3-5 illustrate operation states (1), (2), and (3) of the film-peeling apparatus according to FIG. 1. The controller 30 drives, through the connector 20, the punching member 10 and makes the punching head 11 punch on the positions A. Some of the punched spots may be at the same location (coordinates). The path along which the punching head 11 punches may be either the first edge of the protective film 200 or the second edge of the protective film 200. The punched spots created by the punching head 11 may be completely on the protective film 200, partially on the protective film 200, or completely on the bare area of the substrate 300. The locations to be punched may be predetermined and the sequence which the punching head punches may be predetermined. The time interval between two adjacent punches may vary or keep the same.

Please refer to FIGS. 1-5. The film-peeling apparatus 100 further includes a blowing member 40 and a pneumatic member 50 (see FIG. 2). The blowing member 40 has a blowing opening 41 facing one of the at least one position A. The controller 30 drives the pneumatic member 50 to deliver air to the blowing member 40 and out of the blowing opening 41. In some embodiments, the controller 30 starts to drive the pneumatic member 50 prior to the first punch of the punching head 11 and stop driving the pneumatic member 50 after a predetermined period of time after the last punch of the punching head 11. In some embodiments, the controller 30 drives the pneumatic member 50 for a predetermined period of time at each time or right after each time the punching head 11 punches the punched area. In some embodiments, the controller 30 drives the pneumatic member 50 during the period between two adjacent punches.

In some embodiments, the blowing member 40 is, but not limited to, a needle-shaped nozzle located between the protective film 200 and the substrate 300. The pneumatic member 50 is connected to the blowing member 40 and supplies air to the blowing member 40. In the embodiment shown in FIG. 4, the film-peeling apparatus 100 comprises two the blowing members 40. Each of the blowing members 40 has a blowing opening 41. The blowing members 40 are, respectively, connected to two side surfaces of the main beam 21. The main beam 21 is parallel with the Axis X. In addition, the blowing openings 41 of the blowing members 40 are nearby an edge of the substrate 300. From the side view of the substrate 300 as shown in FIG. 1, the XZ plane, the longitudinal axis of each of the blowing members 40 and the Axis X create an angle. Consequently, when the controller 30 drives the pneumatic member 50, the air out of the blowing openings 41 are from different directions toward the punched area. This would aid the punched area of the protective film 200 to be blown up. In some embodiments, the angle is between 10 to 120 degrees, the diameter of the blowing opening 41 is between 1 to 5 mm, and air pressure of the pneumatic member 50 is between 1 to 5 MPa.

Please refer to FIGS. 1, 1A, 4 and 5. The film-peeling apparatus 100 further includes a clamping member 60 between the connector 20 and the substrate 300. The controller 30 drives the clamping member 60 to grip the blown-up portion of the protective film 200. Then, the controller 30 drives the clamping member 60 to move toward the corner diagonal to the corner the punched area is located. The corner diagonal to the corner the punched area is located is at the directions of X+ and Y+ in FIG. 2. In some embodiments, the controller 30 firstly drives the punching member 10 to make the punching head 11 punch on the positions A. In the consequence, the punched portion of the protective film 200 is pressed, wrinkled, and/or raised. During punches, the controller 30 drives the pneumatic member 50 to deliver air to the blowing member 40 and make the air out of the blowing opening 41. The air blows the punched portion of the protective film 200 and make the punched portion raised. Then, the controller 30 drives the clamping member 60 to grip the raised portion and moves the clamping member 60 toward the corner diagonal to the corner the punched portion is located. Thereafter, the whole protective film 200 is peeled. In some embodiment, the movement that the controller 30 drives the clamping member 60 includes lifting the clamping member 60 in addition to horizontal displacement (from the corner the clamping member 60 is to its diagonal corner). This will make the film-peeling smoother. In some embodiment, the movement the controller 30 drives the clamping member 60 is along the Axis X or Axis Y The distance the controller 30 drives the clamping member 60 to move depends upon the size of the protective film 200 and can be adjusted in accordance with actual situation. In some embodiments, the controller 30 stop driving the pneumatic member 50 at the time or right after the time the clamping member 60 grip the portion of the protective film 20.

Please refer to FIGS. 1 to 5. The clamping member 60 includes a movable element 61 and a stop element 62. The controller 30 drives the clamping member 60 to make the movable element 61 move toward the stop element 62 until the movable element 61 contacts the stop element 62 or until the pressure between the movable element 61 and the stop element 62 reach a preset value. In some embodiments, both the movable element 61 and the stop element 62 are connected to the connector 20. The movable element 61 is movably connected with the main beam 21 while the stop element 62 is fixed to the main beam 21. During the time the punching head 11 punches the positions A, the stop element 21 is close to the positions A. After the punched portion of the protective film 200 is blown and raised, the controller 30 drives the movable element 60 move toward the stop element 21. Consequently, the raised portion of the protective film 200 is gripped by the movable element 60 and the stop element 61.

Please refer to FIGS. 3-5. The punching member 10, driven by the controller 30, moves along a movement path including a first path segment and a second segment. When the punching member 10 moves along the first path segment, the punching member 10 moves, from the top view as shown in FIG. 5, from outside of the substrate 300 toward the bare area 310 and then moves toward the adjacent area 210. When the punching head 11 is above the bare area 310, the controller 30 may drive the punching member 10 to make the punching head 11 punch on the bare area 310. When the punching head 11 is near the adjacent area 210, the controller 30 drives the punching member 30 to make the punching head 11 punch position A. In some embodiments, referring to FIG. 5, the punching head 11, at the point of time T1, punches on the first position A. Then, the punching head 11, at the point of time T2, punches on the second position A. Next, the punching head 11, at the point of time T3, punches on the third position A. Any two of the first, the second, and the third positions A may be completely overlapped, partially overlapped, or not overlapped. The first, the second, and the third positions A may be substantially collinear. Any of the first, the second and the third positions A may be on the bare area 310, on adjacent area 210, on the protective film 200, or between the bare area 310 and the adjacent area 210. Then number of punches is not limited to three and can be adjusted in consideration of actual situation.

Please refer to FIG. 5. The second path segment is connected to the first path segment. After the first path segment, the controller 30 drives the punching member 10 to move along the second path segment. The second path segment is but not limited to a path along Axis X, a path along Axis Y, or a combination of a path along Axis X and a path along Axis Y. In some embodiments, the second path segment is not along Axis Z or Axis Y, but surrounding the adjacent area 210. When the punching member 10 moves along the second path segment, the controller 30 drives the punching member 10 to punch. In some embodiments, referring to FIG. 5, the punching head 11, at the point of time T4, punches on the fourth position A. Then, the punching head 11, at the point of time T5, punches on the fifth position A. Next, the punching head 11, at the point of time T6, punches on the sixth position A. Any two of the fourth, the fifth, and the sixth positions A may be completely overlapped, partially overlapped, or not overlapped. The fourth, the fifth, and the sixth positions A may be substantially collinear. Any of the fourth, the fifth, and the sixth positions A may be on the bare area 310, on adjacent area 210, on the protective film 200, or between the bare area 310 and the adjacent area 210. Then number of punches is not limited to three and can be adjusted in consideration of actual situation. the at least one position A on the bare area 310 and the second edge of the adjacent area 210.

Figure 6:
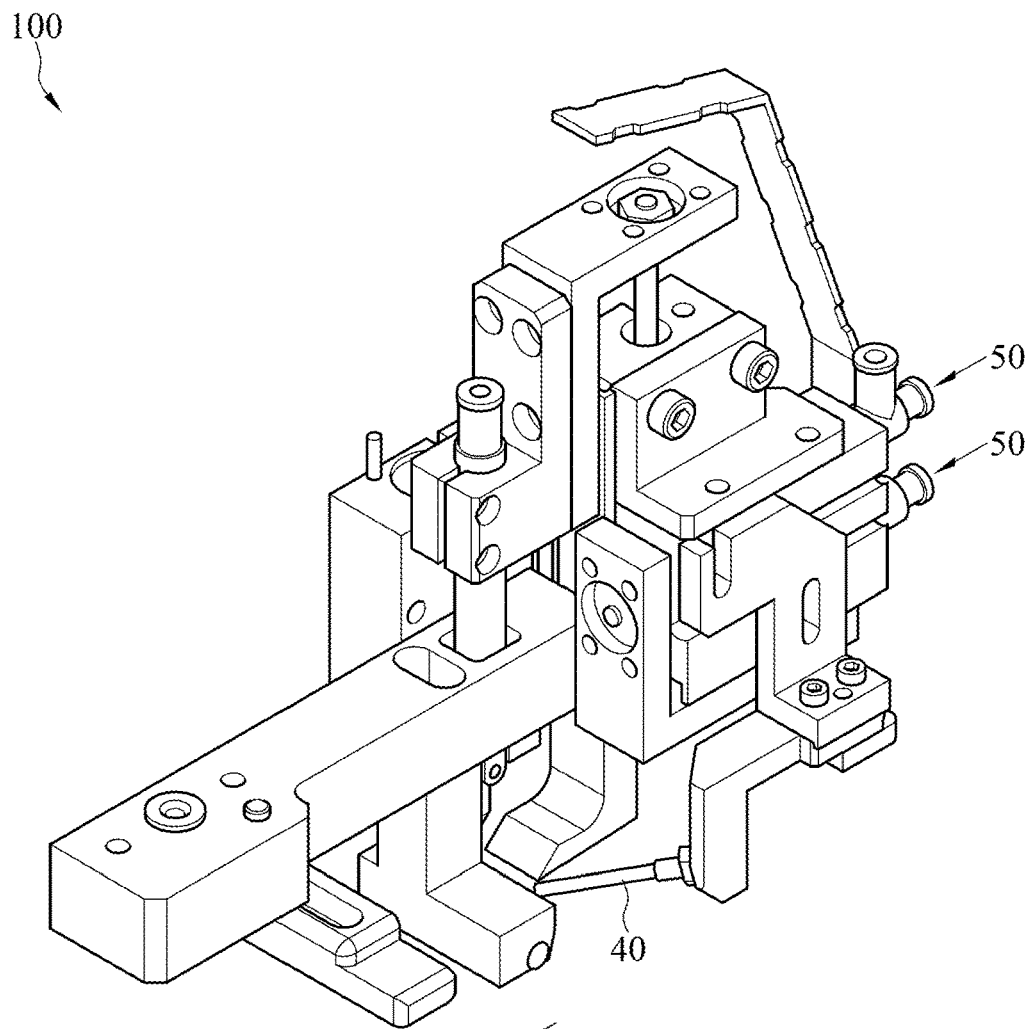
FIG. 6 illustrates a perspective view of a film-peeling apparatus according to a some embodiments of the present disclosures.
Figure 6A:
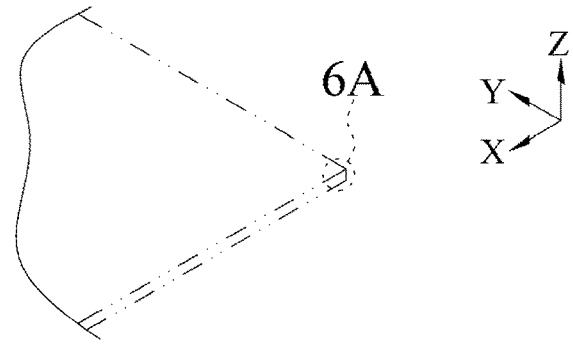
FIG. 6A illustrates a partially enlarged view of the substrate according to FIG. 6.
Figure 6A:
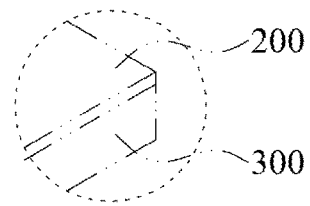
Figure 7:
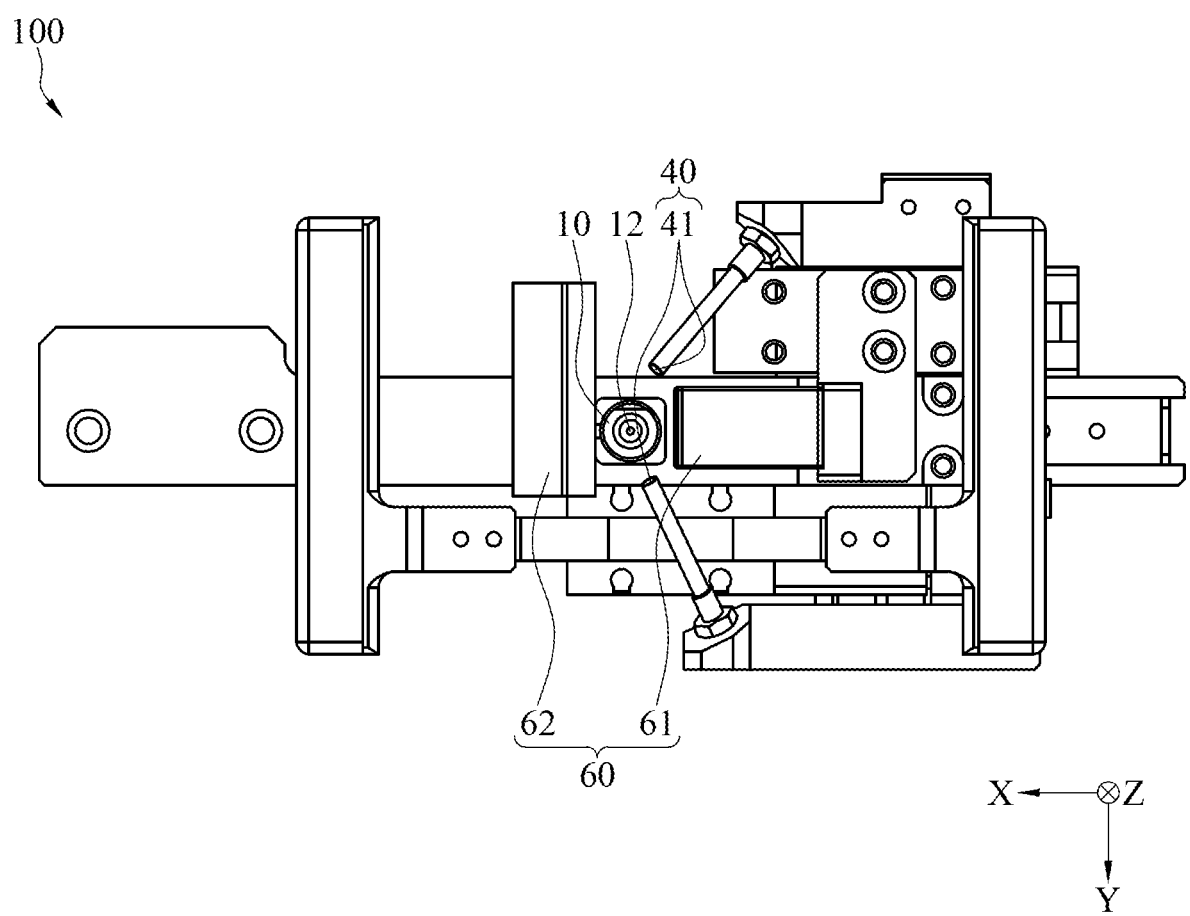
FIG. 7 illustrates a bottom view of the film-peeling apparatus according to FIG. 6.

Please refer to FIGS. 6, 6A and 7. FIG. 6 illustrates a perspective view of a film-peeling apparatus according to some embodiments. FIG. 6A illustrates a partially enlarged view of the substrate according to FIG. 6. FIG. 7 illustrates a bottom view of the film-peeling apparatus of FIG. 6. The film-peeling apparatus 100 adapted to peel a protective film 200. A first edge or the second edge of the protective film 200 flushes with an edge of the substrate 300.

The first edge of the protective film 200 is parallel with the Y-axis and the second edge is parallel with the X-axis. In the embodiment shown in FIGS. 6 and 7, the first edge and the second edge flush with two edges of the substrate 300. In some embodiments, the protective film 200 covers the surface of the substrate 300 entirely, that is, the size of the protective film 200 is substantially equal to the size of the substrate 300. In case that the protective film 200 is smaller than the substrate 300 to cover only a portion of the surface of the substrate 300, and the first edge or the second edge of the protective film 200 flushes with an edge of the substrate 300.

The punching member 10 has a cutting portion 111 which is attached to the punching head 11 and faces the substrate 300. When the punching member 10 is driven by the controller 30 to punch on positions A, the cutting portion 111 creates at least one slit on the protective film 200. Following the above embodiments with the first, the second, the third, the fourth, the fifth and sixth positions A, the cutting portion 111 creates at least one slit on the protective film 200. As mentioned above, the controller 30 drives the pneumatic member 50 to deliver air out of the blowing opening 41 during the punches of the punching member 10. Consequently, the air would flow into the slit and make the protective film 200 be raised. Next, the controller 30 drives the clamping member 60 to grip the raised portion of the protective film 200 and then drives the clamping member 60 to move toward the corner diagonal to the corner the raised portion is. Thereafter, the protective film 200 is peeled.

Please refer to FIGS. 6 and 7 again. FIG. 7 illustrates a top view of the FIG. 6. The film-peeling apparatus 100 includes a pneumatic member 50 and the punching member 10 includes a nozzle 12. The nozzle 12 is integrated with the punching head 11. In other words, the nozzle 12 is inside of the punching head 11. When the pneumatic member 50 is driven by the controller 30, the air from the pneumatic member 50 is blown out from the center of the punching head 11. Specifically, the punching head 11 has a cylinder body with through-hole inside the cylinder body. The through-hole forms the nozzle 12 and connected with the pneumatic member 50. When the controller 30 drives the pneumatic member 50, the air comes out of the nozzle 12 and toward the positions A. Consequently, the air will enter the slit and make the punched portion be raised. Thereafter, the controller 30 drives the clamping member 60 to grip the raised portion.

Figure 8:
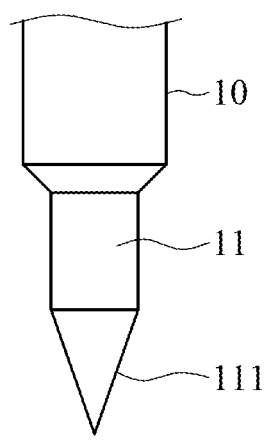
FIG. 8 illustrates a structure diagram of a punching head according to some embodiments.
Figure 9:
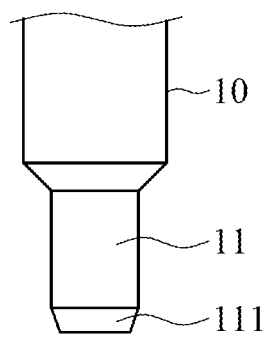
FIG. 9 illustrates a structure diagram of a punching head according to some embodiments.
Figure 10:
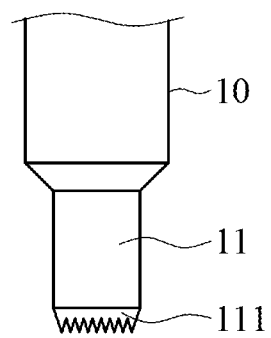
FIG. 10 illustrates a structure diagram of a punching head according to some embodiments.
Figure 11:
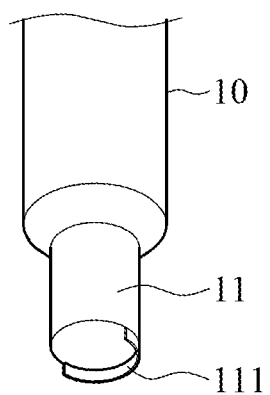
FIG. 11 illustrates a structure diagram of a punching head according to some embodiments.
Figure 12:
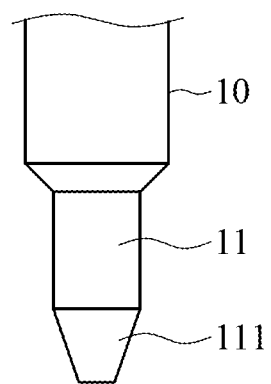
FIG. 12 illustrates a structure diagram of a punching head according to some embodiments.

Please refer to FIGS. 8-12. FIGS. 8-12 illustrate different embodiments of the punching head 11. The punching head 11 has at least one cutting portion 111. The cutting portion 111 may be made of inorganic material or organic material as mentioned above. The cutting portion 111 in the embodiment of FIG. 8 is a cone. The tip of the cone faces the positions A and will create the slit when the punching head 11 punches on the positions A. The cutting portions 111 in the embodiments of FIGS. 9 and 12 are trapezoids. The front edge of each of the trapezoid is a blade which create the slit when the punching head 11 punches on the positions A. The cutting portion 111 in the embodiment of FIG. 10 is in the zigzag shape which creates the slit when the punching head 11 punches on the positions A. The cutting portion 111 in the embodiment of FIG. 11 is a curved blade which creates the slit when the punching head 11 punches on the positions A. In other embodiments, the shape of the cutting portion 111 is triangle, or needle.

The pneumatic member 50 is connected to the nozzle 12 to supply the air thereto. The pneumatic member 50 comprises one nozzle 12 or more nozzles 12 arranged inside the punching head 11 or on the side surface of the punching head 1.

In another embodiment, the film-peeling apparatus 100 further includes a blowing member 40 connected to the connector 20. The blowing member 40 has a blowing opening 41 connected to the pneumatic member 50. In other words, the pneumatic member 50 supplies the blowing member 40 and the nozzle 12 with the air. On delivering the air to the blowing member 40 and the nozzle 12 by pneumatic member 50, the blowing member 40 blows the air toward the positions A. In some embodiment, the blowing member 40 and the nozzle 12 separately blow the positions A.

When the disclosure disclosed in the above detailed description, features and advantages of the embodiment by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A film-peeling apparatus, adapted to peel a protective film on a surface of a substrate, the surface of the substrate having a bare area which is not covered by the protective film, the film-peeling apparatus comprising:
   a punching member comprising a punching head and a nozzle, wherein the nozzle is integrated with the punching head;
   a connector, connected to the punching member;
   a pneumatic member for delivering air; and
   a controller, configured for driving, through the connector, the punching member to punch at predetermined positions nearby or on a first edge of the protective film adjacent to the bare area, and driving the pneumatic member to deliver air to the punching head, and the air is blown out from a center of the punching head.

2. The film-peeling apparatus according to claim 1, wherein the controller is configured for driving the punching head to punch the predetermined positions.

3. The film-peeling apparatus according to claim 1, further comprising:
   a blowing member having at least one blowing opening, the at least one blowing opening being toward the predetermined positions when the blowing member is driven by the controller, wherein the pneumatic member, driven by the controller, delivers the air to the blowing member and out of the at least one blowing opening.

4. The film-peeling apparatus according to claim 3, wherein the blowing member is a needle-shaped nozzle.

5. The film-peeling apparatus according to claim 3, wherein an angle between an longitudinal axis of each of the blowing members and an Axis X is between 10 to 120 degrees, a diameter of the blowing opening is between 1 to 5 mm, and air pressure of the pneumatic member is between 1 to 5 MPa.

6. The film-peeling apparatus according to claim 1, wherein the punching head has a cutting portion, the cutting portion creates at least one slit on the protective film during punches of the punching head on the predetermined positions.

7. The film-peeling apparatus according to claim 6, wherein the cutting portion is a cone with a tip, the tip faces the edge of the protective film.

8. The film-peeling apparatus according to claim 6, wherein the cutting portion is a trapezoid with front edge facing the edge of the protective film, the front edge is a blade that creates the at least one slit on the protective film.

9. The film-peeling apparatus according to claim 6, further comprising a clamping member, the controller adapted for driving the clamping member to grip above at one of the predetermined positions and then for driving the clamping member to move toward a corner diagonal to a punched edge of the protective film.

10. The film-peeling apparatus according to claim 9, wherein the clamping member comprises a stop element and a movable element, the controller is configured to move the movable element to contact the stop element to grip.

11. The film-peeling apparatus according to claim 1, wherein the controller comprises a communicating unit, a storage and a processing unit connected with the communicating unit and the storage, the processing unit controls the communicating unit to receive or transmit control commands, and the storage stores control data and at least one movement path.

12. A film-peeling apparatus, adapted to peel a protective film on a surface of a substrate, one edge of the protective film being flush with one edge of the substrate, the film-peeling apparatus comprising:
  a punching member, having a punching head and a nozzle, the punching member has a cutting portion;
  a connector, connected to the punching member;
  a blowing member, having a blowing opening;
  a pneumatic member, when being driven, for delivering air to the blowing member, and the nozzle; and
  a controller, configured for
    driving the punching member to make the punching head punch on the edge of the protective film and to make the cutting portion create at least one slit on the protective film;
    driving the blowing member to make the blowing opening face the punched edge of the protective film; and
    driving the pneumatic member to deliver air out of the blowing opening and out of the nozzle.

13. The film-peeling apparatus according to claim 12, further comprising a clamping member, the controller adapted for driving the clamping member to grip above the punch edge and then for driving the clamping member to move toward a corner diagonal to a punched edge of the protective film.

14. The film-peeling apparatus according to claim 13, wherein the clamping member comprises a stop element and a movable element, the controller is configured to move the movable element to contact the stop element to grip.

15. The film-peeling apparatus according to claim 14, wherein the cutting portion is a cone with a tip, the tip faces the edge of the protective film.

16. The film-peeling apparatus according to claim 14, wherein the cutting portion is a trapezoid with front edge facing the edge of the protective film, the front edge is a blade that creates the at least one slit on the protective film.

17. The film-peeling apparatus according to claim 12, wherein the controller comprises a communicating unit, a storage and a processing unit connected with the communicating unit and the storage, the processing unit controls the communicating unit to receive or transmit control commands, and the storage stores control data and at least one movement path.

18. The film-peeling apparatus according to claim 12, wherein the blowing member is a needle-shaped nozzle.

19. The film-peeling apparatus according to claim 12, wherein an angle between an longitudinal axis of each of the blowing members and an Axis X is between 10 to 120 degrees, a diameter of the blowing opening is between 1 to 5 mm, and air pressure of the pneumatic member is between 1 to 5 MPa.

\* \* \* \* \*